US010242885B2

(12) United States Patent
Anthis et al.

(10) Patent No.: US 10,242,885 B2
(45) Date of Patent: Mar. 26, 2019

(54) SELECTIVE DRY ETCHING OF METAL FILMS COMPRISING MULTIPLE METAL OXIDES

(71) Applicant: Applied Materials, Inc., Santa Clara, CA (US)

(72) Inventors: Jeffrey W. Anthis, San Jose, CA (US); David Thompson, San Jose, CA (US); Benjamin Schmiege, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/606,461

(22) Filed: May 26, 2017

(65) Prior Publication Data

US 2018/0342403 A1 Nov. 29, 2018

(51) Int. Cl.

| H01L 21/302 | (2006.01) |
|---|---|
| H01L 21/465 | (2006.01) |
| H01L 21/02 | (2006.01) |
| H01L 21/3213 | (2006.01) |
| H01L 21/28 | (2006.01) |

(52) U.S. Cl.
CPC ........ *H01L 21/465* (2013.01); *H01L 21/0228* (2013.01); *H01L 21/02565* (2013.01); *H01L 21/28194* (2013.01); *H01L 21/32135* (2013.01)

(58) Field of Classification Search
CPC ........... H01L 21/0228; H01L 21/28194; H01L 21/31122; H01L 21/32135
USPC ............................ 438/705, 722, 742; 216/76
See application file for complete search history.

(56) References Cited

U.S. PATENT DOCUMENTS

| 5,782,986 | A | 7/1998 | Butterbaugh et al. |
|---|---|---|---|
| 6,852,635 | B2 | 2/2005 | Satta et al. |
| 7,767,106 | B2 | 8/2010 | Chang |
| 8,940,647 | B2 | 1/2015 | Liu et al. |
| 2014/0326186 | A1* | 11/2014 | Paranjpe ................ C30B 25/10 118/728 |
| 2014/0332372 | A1 | 11/2014 | Kamada et al. |
| 2015/0345029 | A1 | 12/2015 | Wang et al. |
| 2017/0186597 | A1* | 6/2017 | Girard ................ H01L 21/0228 |
| 2017/0285477 | A1* | 10/2017 | Tanigaki ................ G03F 7/095 |

FOREIGN PATENT DOCUMENTS

| JP | 5170638 B2 | 3/2013 |
|---|---|---|
| JP | 6275441 B2 | 2/2018 |

OTHER PUBLICATIONS

George, Steven M., et al., "Prospects for Thermal Atomic Layer Etching Using Sequential, Self-Limiting Fluorination and Ligand-Exchange Reactions", ACS Nano 2016, vol. 10, pp. 4889-4894.
Zywotko, David. R., et al., "Thermal Atomic Layer Etching of ZnO by a "Conversion-Etch" Mechanism Using Sequential Exposures of Hydrogen Fluoride and Trimethylaluminum", Chem. Mater. 2017, vol. 29, pp. 1183-1191.
PCT International Search Report and Written Opinion in PCT/US2018/033891 dated Sep. 11, 2018, 9 pages.

* cited by examiner

*Primary Examiner* — Binh X Tran
(74) *Attorney, Agent, or Firm* — Servilla Whitney LLC

(57) ABSTRACT

A process to selectively etch a substrate surface comprising multiple metal oxides comprising exposing the substrate surface to a halogenation agent, and then exposing the substrate surface to a ligand transfer agent. The etch rate of the metals in the multiple metal oxides is substantially uniform.

20 Claims, 1 Drawing Sheet

SELECTIVE DRY ETCHING OF METAL FILMS COMPRISING MULTIPLE METAL OXIDES

FIELD

Embodiments of the disclosure relate to a process for etching metal films comprised of multiple metal oxides. More particularly, embodiments of the disclosure are directed to methods for selectively etching indium gallium zinc oxide (IGZO) films from substrates.

BACKGROUND

Oxide semiconductors are of interest for use in active matrix panels for display applications as well as other microelectronic devices. One of the most promising oxide materials is indium-gallium-zinc-oxide (IGZO) which has been shown to have superior electrical properties. IGZO has high mobility, electrical stability, and excellent uniformity. Since IGZO can be formed as a film on a substrate at relatively low temperatures, it has been applied to lightweight portable electronic items using thin film displays. Yet the processing of these films remains a challenge.

Traditional processes for etching metal oxide films are described as either wet processes or dry processes. Wet processes submerge the substrate in a chemical etching liquid to remove layers of substrate surface material. Dry processes expose the substrate to gaseous etching reagents.

A common form of dry etch process is a plasma-based etch process, or plasma etching. Plasma etching involves a high-speed stream of plasma of an appropriate gas mixture being exposed to a sample. The plasma stream can be continuous or be administered in pulses or waves. The etch process generally relies on radical reactions. During the reaction process, the plasma generates volatile etch products from the chemical reactions between the elements of the substrate surface and the plasma. As these volatile products are removed from the substrate surface, the thickness of the substrate decreases resulting in an etched surface. The remaining surface is then exposed allowing for the potential of a continued reaction. Once a predetermined amount of substrate has been removed, the process can be discontinued.

There are however several drawbacks to the etching of substrates comprising metal oxides using plasma etching. First, plasma etching can etch different materials at different rates. When etching substrates comprising multiple chemical components, this can result in a buildup of certain species on the substrate surface which are not as readily etched as others. Second, the conditions and reagents used in plasma etching have the potential to modify the composition of the film or incompletely etching one or more of the elements. Plasma etching can often introduce or create contaminants which modify the surface's physical and chemical properties.

As an alternative dry etch process, thermal etching relies on favorable chemical reactions on the surface of the substrate. Thermal etching processes, when available, are generally preferred because they use lower reaction temperatures and allow for greater control of the etch process than plasma etching processes. However, thermal etch processes have many of the same drawbacks as plasma etch processes. The drawbacks related to etch rates of different materials proceeding at different rates, as well as contamination of the film remaining after the etching process remain a concern in thermal etch processes as well. Thermal etch processes are also limited by the reactions available which must be favorable and are limited due to available reagents, reaction conditions and substrate materials.

Therefore there is a need for etch processes to etch mixed metal oxide film.

SUMMARY

One or more embodiments of the disclosure are directed to methods of etching a substrate surface. The methods comprise exposing a substrate surface comprising multiple metal oxides to a halogenation agent. The halogenation agent comprises one or more of HF, $NF_3$, $Cl_2$, $BCl_3$, a compound with the empirical formula $SF_y$, where y is 2 to 6, or $C_aH_bX_c$ where X is a halogen, a is 1 to 6, b is 1 to 13 and c is 1 to 13. The substrate surface is exposed to a ligand transfer agent comprising one or more of $MR_2X$ or $MR_3$, where M is In, Ga, Al or B, R is a C1 to C6 group, and X is a halogen. The etch rates of the metals in the multiple metal oxides are substantially uniform.

Additional embodiments of the disclosure are directed to methods of etching a substrate surface. The methods comprise providing a substrate surface comprising indium oxide, gallium oxide and zinc oxide. The substrate surface is exposed to HF to form a halogenated substrate surface. The halogenated substrate surface is exposed to $Al(CH_3)_3$ to etch the halogenated substrate surface to remove one or more of the indium oxide, gallium oxide or zinc oxide. The etch rates of the indium oxide, gallium oxide and zinc oxide are substantially uniform.

Further embodiments of the disclosure are directed to methods of etching a substrate surface. The methods comprise providing a substrate having a first surface and a second surface. The first surface comprises silicon oxide and the second surface comprises indium oxide, gallium oxide and zinc oxide. The substrate is exposed to a halogenation agent to form a halogenated second surface. The substrate is exposed to a ligand transfer agent to etch the halogenated second surface to remove one or more of the indium oxide, gallium oxide or zinc oxide. The etch rates of the indium oxide, gallium oxide and zinc oxide are substantially uniform. An etch rate of the second surface is greater than or equal to about 25 times an etch rate of the first surface.

BRIEF DESCRIPTION OF THE DRAWING

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

Figure 1A:
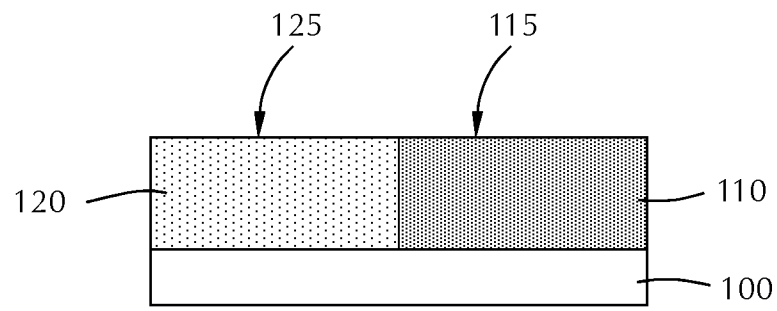
FIGS. 1A through 1C illustrates a schematic representation of a selective etch process for a substrate with two different material surfaces.

Embodiments of the disclosure provide reagents and processes for etching substrate surfaces which comprise multiple metal oxides. The process of various embodiments uses dry thermal etch techniques, such as an atomic layer etching (ALE) to etch films comprising multiple metal oxides.

A "substrate surface", as used herein, refers to any portion of a substrate or portion of a material surface modified on a substrate upon which film processing or etching is performed. For example, a substrate surface on which processing can be performed include materials such as silicon, silicon oxide, silicon nitride, doped silicon, germanium, gallium arsenide, glass, sapphire, and any other materials such as metals, metal nitrides, metal oxides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been etched from a substrate surface, the exposed surface becomes the substrate surface. Substrates may have various dimensions, such as 200 mm or 300 mm diameter wafers, as well as, rectangular or square panes. In some embodiments, the substrate comprises a rigid discrete material.

As used herein, "etch rate" is defined as the rate at which a given material is removed from the substrate surface. An etch rate which is "substantially uniform" is defined as one in which the removal of different metal species from the substrate surface occurs such that there is not an accumulation of any one species relative to another. In other words, the relative metal composition of the substrate surface remains similar throughout the etch process.

A selective etching process is one which etches only part of a substrate surface. In such a process, one portion of the substrate surface will be reduced in thickness, or etched, more significantly than a different substrate portion. The selectivity of an etching process is generally expressed as a multiple of etch rate. For example, if one surface is etched 25 times faster than a different surface, the process would be described as having a selectivity of 25:1. In this regard, higher ratios indicate more selective etch processes.

"Atomic layer etching", "ALE", "cyclical etching" or the like, as used herein, refers to the sequential exposure of two or more reactive compounds to etch a layer of material from a substrate surface. As used in this specification and the appended claims, the terms "reactive compound", "reactive gas", "reactive species", "reagent", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed sequentially to the two or more reactive compounds which are introduced into a reaction zone of a processing chamber. In a time-domain ALE process, exposure to each reactive compound is separated by a time delay to allow each compound to adhere and/or react on the substrate surface and then be purged from the processing chamber. In a spatial ALE process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALE process, a first reactive gas or compound A is pulsed into the reaction zone followed by a first time delay. Next, a second precursor or compound B is pulsed into the reaction zone followed by a second delay. During each time delay, an inert purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a predetermined etch depth or film thickness remains on the substrate surface. In either scenario, the ALE process of pulsing compound A, purge gas, compound B and purge gas is a cycle. Either compound A or compound B can be the first reactive gas exposed in a cycle.

In an embodiment of a spatial ALE process, a first reactive gas and second reactive gas are delivered simultaneously to reaction zone that are separated by an gas curtain comprising one or more purge gas ports and/or one or more vacuum streams. As used in this specification and the appended claims, the term "vacuum stream" refers to a flow of gas exiting the process region or process chamber, for example, to a foreline or vacuum pump. The substrate is moved relative to the gas delivery apparatus so that any given point on the substrate is exposed to the first reactive gas and the second reactive gas.

In some embodiments, a method of etching a substrate surface comprising multiple metal oxides comprises exposing the substrate surface to a halogenation agent, and exposing the substrate surface to a ligand transfer agent, wherein the etch rate of the metals in the multiple metal oxides is substantially uniform.

In some embodiments, the multiple metal oxides comprise indium oxide. In some embodiments, the multiple metal oxides comprise gallium oxide. In some embodiments, the multiple metal oxides comprise zinc oxide. In some embodiments, the multiple metal oxides comprise indium oxide, gallium oxide and zinc oxide. In some embodiments, the multiple metal oxide film has metals consisting essentially of indium, gallium and zinc. As used in this regard, the term "consists essentially of" means that the metal composition of the film is greater than or equal to about 95%, 98% or 99%, on an atomic basis, of the stated metals.

In some embodiments the halogenation agent comprises one or more of HF, $NF_3$, $Cl_2$, $BCl_3$, a compound with the empirical formula $SF_n$, where n is 2 to 6, or $C_aH_bX_c$ where X is a halogen, a is 1 to 6, b is 1 to 13 and c is 1 to 13. In some embodiments, the halogenation agent comprises HF. In some embodiments, the halogenation agent comprises $NF_3$. In some embodiments, the halogenation agent comprises $Cl_2$. In some embodiments, the halogenation agent comprises $BCl_3$. In some embodiments, the halogenation agent comprises $SF_4$. In some embodiments, the halogenation agent comprises $SF_6$. In some embodiments, the halogenation agent consists essentially of HF. In some embodiments, the halogenation agent consists essentially of $NF_3$. In some embodiments, the halogenation agent consists essentially of $Cl_2$. In some embodiments, the halogenation agent consists essentially of $BCl_3$. In some embodiments, the halogenation agent consists essentially of $SF_4$. In some embodiments, the halogenation agent consists essentially of $SF_6$. As used in this regard, the term "consists essentially of"

means that the species acting as a halogenation agent is greater than or equal to about 95%, 98% or 99%, on a weight basis. The addition of inert, diluent and/or carrier gases is not included in the species acting as a halogenation agent for this purpose.

In some embodiments, the halogenation agent comprises HF-pyridine. Pyridine may be used as a stabilizing agent for HF in the halogenation agent of some processes. In some embodiments, the halogenation agent consists essentially of HF-pyridine. As used in this regard, term "consists essentially of HF-pyridine" means that the sum of the HF and pyridine is greater than or equal to about 95%, 98% or 99%, by weight, of the halogenating or stabilizing species in the halogenation agent.

In some embodiments, the halogenation agent comprises a compound with the empirical formula $SF_n$ where n is 2 to 6. In some embodiments, n is 2. In some embodiments, n is 3. In some embodiments, n is 4. In some embodiments, n is 5. In some embodiments, n is 6. In some embodiments, there is more than one sulfur atom and the number of fluorine atoms is a multiple of the number of fluorine atoms, in accordance with the empirical formula. For example, the halogenation agent of some embodiments comprises $S_2F_6$.

In some embodiments, the halogenation agent comprises $C_aH_bX_c$ where X is a halogen, a is 1 to 6, b is 1 to 13 and c is 1 to 13. In some embodiments, X comprises F. In some embodiments, X comprises Cl. In some embodiments, X comprises Br. In some embodiments, X comprises I. In some embodiments, X consists essentially of F. In some embodiments, X consists essentially of Cl. In some embodiments, X consists essentially of Br. In some embodiments, X consists essentially of I. As used in this regard, the term "consists essentially of" means that greater than or equal to about 95%, 98% or 99% of the halogen atoms are the stated halogen, on an atomic basis. In some embodiments, a is 2 to 6, 3 to 6, 4 to 6 or 5 to 6. In some embodiments, b is greater than or equal to 2, 3, 4, 5, 6, 7, 8, 9, 10, 11 or 12. In some embodiments, c is greater than or equal to 2, 3, 4, 5, 6, 7, 8, 9, 10, 11 or 12. In some embodiments, the sum of b and c is equal to 2a+2. In some embodiments, a is 2 and b is 1 to 5 and c is 1 to 5. In some embodiments, a is 3 and b is 1 to 7 and c is 1 to 7. In some embodiments, a is 4 and b is 1 to 9 and c is 1 to 9. In some embodiments, a is 5 and b is 1 to 11 and c is 1 to 11. In some embodiments, a is 6 and b is 1 to 13 and c is 1 to 13. In some embodiments, the halogenation agent comprises an unsaturated hydrocarbon having a general formula $C_aH_bX_c$, where X is a halogen, a is 1 to 6, b is 1 to 11 and c is 1 to 11, and the sum of b and c is 2a.

In some embodiments, the ligand transfer agent comprises one or more of $MR_2X$ or $MR_3$, where M is In, Ga, Al or B, R is a C1 to C6 group, and X is a halogen. A "C1 to C6 group", or similar term, as used herein, refers to any group containing from 1 to 6 carbon atoms. The group can be saturated or unsaturated, straight, branched or cyclic. In some embodiments, the ligand transfer agent comprises one or more of $MR_2X$, where M is In, Ga, Al or B, R is a C1 to C6 group, and X is a halogen. In some embodiments, the ligand transfer agent comprises one or more of $MR_3$, where M is In, Ga, Al or B, and R is a C1 to C6 group. In some embodiments, R is a C2 to C6 group, or a C3 to C6 group, or a C4 to C6 group or a C5 to C6 group. In some embodiments, X consists essentially of fluorine, chlorine, bromine or iodine. As used in this manner, "consists essentially of" means that the stated halogen is greater than or equal to about 95%, 98% or 99% of the total halogen atoms in the stated species. In some embodiments, the ligand transfer agent consists essentially of $MR_2X$, where M is In, Ga, Al or B, R is a C1 to C6 group, and X is a halogen. In some embodiments, R is a C2 to C6 group, or a C3 to C6 group, or a C4 to C6 group or a C5 to C6 group. In some embodiments, the ligand transfer agent consists essentially of $MR_3$, where M is In, Ga, Al or B, R is a C1 to C6 group, and X is a halogen. In some embodiments, R is a C2 to C6 group, or a C3 to C6 group, or a C4 to C6 group or a C5 to C6 group.

In some embodiments, M in the ligand transfer agent comprises In. In some embodiments, M in the ligand transfer agent comprises Ga. In some embodiments, M in the ligand transfer agent comprises Al. In some embodiments, M in the ligand transfer agent comprises B. In some embodiments, X in the ligand transfer agent comprises F. In some embodiments, X in the ligand transfer agent comprises Cl. In some embodiments, X in the ligand transfer agent comprises Br. In some embodiments, X in the ligand transfer agent comprises I. In some embodiments, M in the ligand transfer agent consists essentially of In. In some embodiments, M in the ligand transfer agent consists essentially of Ga. In some embodiments, M in the ligand transfer agent consists essentially of Al. In some embodiments, M in the ligand transfer agent consists essentially of B. As used in this regard, the term "consists essentially of" means that the stated element makes up greater than or equal to about 95%, 98% or 99% of the total metal atoms in the ligand transfer agent. In some embodiments, X in the ligand transfer agent consists essentially of F. In some embodiments, X in the ligand transfer agent consists essentially of Cl. In some embodiments, X in the ligand transfer agent consists essentially of Br. In some embodiments, X in the ligand transfer agent consists essentially of I. As used in this regard, the term "consists essentially of" means that the stated element makes up greater than or equal to about 95%, 98% or 99% of the total halogen atoms in the ligand transfer agent.

Some embodiments of the disclosure are directed to methods of etching a substrate surface comprising a mixture of metal oxides (e.g., indium oxide, gallium oxide and zinc oxide). The substrate surface is exposed to a halogenation agent (e.g., HF) to form a halogenated substrate surface. The halogenated substrate surface is exposed to a ligand transfer agent (e.g., $Al(CH_3)_3$) to etch the halogenated substrate surface to remove one or more of the metal oxides (e.g., (indium oxide, gallium oxide or zinc oxide) so that the etch rates of the metal oxides are substantially uniform.

Some embodiments of the disclosure are directed to methods of selectively etching a mixed metal oxide surface relative to a different surface. Referring to FIG. 1A, a substrate 100 has two material surfaces; a first material 110 and a second material 120. The first material 110 has a first material surface 115 and the second material has a second material surface 125.

Figure 1B:
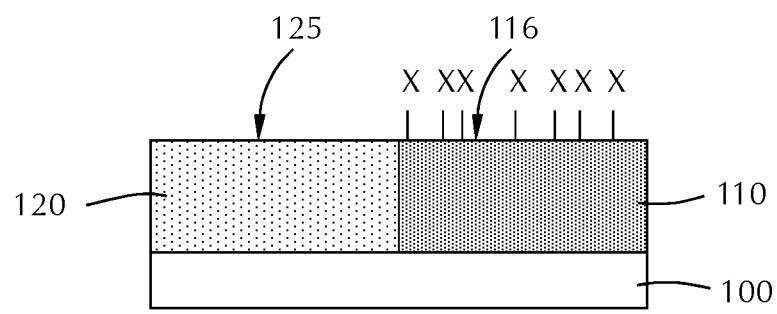

The substrate 100 is exposed to a halogenation agent to create a halogenated first material surface 116, as shown in FIG. 1B. Without being bound by any particular theory of operation, it is believed that the halogenation agent replaces an oxygen atom to form a metal halide on the substrate surface. The second material surface 125 remains substantially unhalogenated. However, those skilled in the art will understand that it is possible that a small amount of the second material surface 125 may become halogenated, relative to the first material surface 115.

The halogenation agent can be exposed to the substrate with or without a carrier or diluent gas. In some embodiments, the halogenation agent is co-flowed with an inert gas that can act as a carrier or diluent.

In some embodiments, the halogenation agent is co-flowed with a non-inert gas. A non-inert gas may influence the selectivity of the halogenation process on different substrates. Suitable non-inert gases include, but are not limited to, NO, $NO_2$, $NH_3$, $H_2$, $O_2$, HBr, HCl and combinations thereof.

The halogenation process can occur by a thermal process or with plasma. In some embodiments, the halogenation is plasma-enhanced using direct or remote plasma. The plasma can be capacitively coupled or inductively coupled and can use any suitable gases. In some embodiments, the plasma comprises one or more of the non-inert gases. In some embodiments, the halogenation agent is pulsed into the plasma or flowed continuously. In some embodiments, the plasma further comprises one or more of He, $N_2$ or Ar.

Figure 1C:
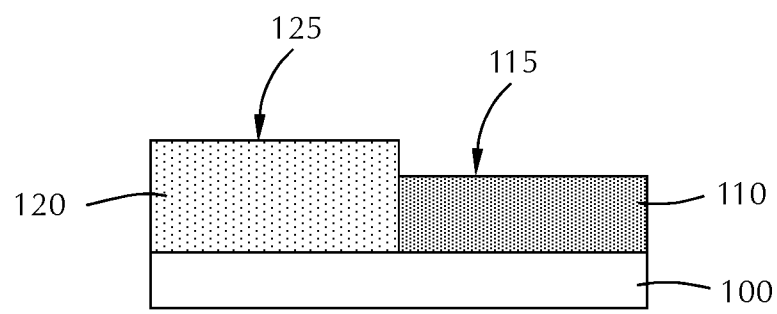

After halogenation, the substrate 100 is exposed to a ligand transfer agent. The ligand transfer agent is believed to react with the metal halide forming the halogenated first material surface 116, removing the metal halide. Removal of the metal halide results in exposure of another layer of metal oxide at the first material surface 115 and reduces the overall height of the first material 110, as illustrated in FIG. 1C.

The substrate 100 can be repeatedly exposed to the halogenation agent to form the halogenated first material surface 116 followed by the ligand transfer agent to etch the metal halide from the surface. The cycle can be repeated to remove all or some portion of the first material 110 while removing substantially none or very little of the second material 120. As used in this regard, the term "substantially none or very little" means that the height of the second material 120 decreases by less than about 10 Å, 5 Å, 4 Å, 3 Å, 2 Å or 1 Å for a decrease of 100 Å of the first material 110.

In another embodiment a method of etching a substrate surface comprises providing a substrate 100 having a first material 110 comprising indium oxide, gallium oxide and zinc oxide and a second material 120 comprising silicon oxide. The substrate 100 is exposed to a halogenation agent to form a halogenated first material surface 116 comprising one or more of indium halide, gallium halide or zinc halide. The substrate 100 is then exposed to a ligand transfer agent to etch or remove the halogenated first material surface to remove one or more of the indium halide, gallium halide or zinc halide. The etch rates of the indium oxide, gallium oxide and zinc oxide are substantially uniform, and an etch rate of the first material is greater than or equal to about 25 times an etch rate of the second material.

As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the etching of the substrate surface, for example, by polishing, oxidation, annealing, baking, or the like.

The substrate may be any substrate capable of having a material comprising metal oxides etched therefrom, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like. In some embodiments, one or more additional layers may be disposed on the substrate. For example, in some embodiments, a layer comprising a metal, a nitride, an oxide, or the like, or combinations thereof may be disposed on the substrate and may have the metal oxide containing layer etched from or selectively to such layer or layers.

In time-domain ALE embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first process gas may be provided to the process chamber followed by a purge with an inert gas. Next, a second process gas may be provided to the process chamber followed by a purge with an inert gas. In some embodiments, the inert gas may be continuously provided to the process chamber and the first process gas may be dosed or pulsed into the process chamber followed by a dose or pulse of the second process gas into the process chamber. In such embodiments, a delay or pause may occur between the dose of the first process gas and the second process gas, allowing the continuous flow of inert gas to purge the process chamber between doses of the process gases.

In spatial ALE embodiments, the different process gases are flowed into different process regions of the processing chamber so that exposure to each of the process gases can occur simultaneously to different parts of the substrate or to different substrates so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases.

In any embodiment of a time-domain ALE or spatial ALE process, the sequence may be repeated until a predetermined thickness is etched from the substrate surface.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of metal oxides being etched and the geometry of the device being formed. A dose time should be long enough to provide a volume of compound sufficient to adsorb/chemisorb onto substantially the entire surface of the substrate and form a layer of a process gas component thereon.

As described above, time-domain ALE type embodiments of this disclosure can begin with either the exposure of the substrate surface to a reactive gas comprising a halogenation agent or a reactive gas comprising a ligand transfer agent. The process of etching the multiple metal oxides may begin by exposing the substrate to a first reactive gas. In some embodiments, the first reactive gas comprises a halogenation agent and is exposed to the substrate for a first period of time. The first reactive gas reacts with the metal oxides on the substrate surface to create a metal halide layer.

A "process gas", as used herein, can be a reactive gas either comprising a halogenation agent or comprising a ligand transfer agent. A process gas may be provided in one or more pulses or continuously. The flow rate of the process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The process gas can be provided at any suitable pressure including, but not limited to, a pressure in the range of about 5 mTorr to about 25 Torr, or in the range of about 100 mTorr to about 20 Torr, or in the range of about 5 Torr to about 20 Torr, or in the range of about 50 mTorr to about 2000 mTorr, or in the range of about 100 mTorr to about 1000 mTorr, or in the range of about 200 mTorr to about 500 mTorr.

The period of time that the substrate is exposed to the process gas may be any suitable amount of time necessary to allow the process gas to react with the substrate surfaces. For example, the process gas may be flowed into the process chamber for a period of about 0.1 seconds to about 90 seconds. In some time-domain ALE processes, the process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the process gas. The inert gas may be mixed with the process gas (e.g., as a diluent gas) or separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, combinations thereof, or the like. In one or more embodiments, the process gas is mixed with argon prior to flowing into the process chamber.

The temperature of the substrate during deposition can be controlled, for example, by setting the temperature of the substrate support or susceptor. In some embodiments the substrate is held at a temperature in the range of about 100° C. to about 600° C., or in the range of about 150° C. to about 500° C., or in the range of about 200° C. to about 400° C., or in the range of about 250° C. to about 300° C. In one or more embodiments, the substrate is maintained at a temperature less than about 400° C., or less than about 350° C., or less than about 300° C.

In addition to the foregoing, additional process parameters may be regulated while exposing the substrate to the process gas. For example, in some embodiments, the process chamber may be maintained at a pressure of about 0.2 to about 100 Torr, or in the range of about 0.3 to about 50 Torr, or in the range of about 0.4 to about 20 Torr, or in the range of about 0.5 to about 6 Torr.

Next the process chamber (especially in time-domain ALE) may be purged using an inert gas. (This may not be needed in spatial ALE processes as there is a gas curtain separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the first process gas. In embodiments where the inert gas is the same, the purge may be performed by diverting the first process gas from the process chamber, allowing the inert gas to flow through the process chamber, purging the process chamber of any excess first process gas components or reaction byproducts. In some embodiments, the inert gas may be provided at the same flow rate used in conjunction with the first process gas, described above, or in some embodiments, the flow rate may be increased or decreased. For example, in some embodiments, the inert gas may be provided to the process chamber at a flow rate of about 0 to about 10000 sccm to purge the process chamber. In spatial ALE, purge gas curtains are maintained between the flows of process gases and purging the process chamber may not be necessary. In some embodiments of a spatial ALE process, the process chamber or region of the process chamber may be purged with an inert gas.

The flow of inert gas may facilitate removing any excess first process gas components and/or excess reaction byproducts from the process chamber to prevent unwanted gas phase reactions of the first and second process gases. For example, the flow of inert gas may remove excess halogenation agent from the process chamber, preventing a reaction between the halogenation agent and the ligand transfer agent.

Next the substrate surface is exposed to a second reactive gas. In some embodiments, the second reactive gas comprises a ligand transfer agent and is exposed to the substrate surface for a second period of time. The second reactive gas reacts with the metal halides on the substrate surface to create a volatile metal species comprising the metal of the metal halide.

Next the process chamber may be purged using an inert gas. The inert gas may be any inert gas, for example, such as argon, helium, neon, or the like. In some embodiments, the inert gas may be the same, or alternatively, may be different from the inert gas provided to the process chamber during previous process steps. In embodiments where the inert gas is the same, the purge may be performed by diverting the second process gas from the process chamber, allowing the inert gas to flow through the process chamber, purging the process chamber of any excess second process gas components or reaction byproducts. In some embodiments, the inert gas may be provided at the same flow rate used in conjunction with the second process gas, described above, or in some embodiments, the flow rate may be increased or decreased. For example, in some embodiments, the inert gas may be provided to the process chamber at a flow rate of greater than 0 to about 10,000 sccm to purge the process chamber.

While the generic embodiment of the processing method described above includes only two pulses of reactive gases, it will be understood that this is merely exemplary and that additional pulses of reactive gases may be used. The pulses can be repeated in their entirety or in part. For example all three pulses could be repeated or only two can be repeated. This can be varied for each cycle.

Next it is determined whether the etched surface has achieved a predetermined depth. If the predetermined depth has not been achieved, the method cycles back to the beginning to continue etching the substrate surface until the predetermined depth is reached. Upon completion of etching of the substrate surface to a desired thickness, the method generally ends and the substrate can proceed for any further processing.

In some embodiments, the substrate surface is comprised of multiple surfaces. In these embodiments, the process described above may result in the selective of etching of one surface of the substrate surface relative to other surfaces of the substrate surface. In some embodiments, the etch selectivity is greater than or equal to about 10:1 or about 15:1 or about 20:1 or about 25:1 or about 30:1 or about 36:1 or about 40:1 or about 50:1.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of etching a substrate surface, the method comprising:
    exposing the substrate surface comprising a mixed metal oxide to a halogenation agent, the substrate surface having a relative metal composition, the halogenation agent comprising one or more of HF, $NF_3$, $Cl_2$, $BCl_3$, a compound with an empirical formula $SF_n$, where n is 2 to 6, or $C_aH_bX_c$ where X is a halogen, a is 1 to 6, b is 1 to 13 and c is 1 to 13; and
    exposing the substrate surface to a ligand transfer agent to etch the substrate surface, the ligand transfer agent comprising one or more of $MR_2X$ or $MR_3$, where M is In, Ga, Al or B, R is a C1 to C6 group, and X is a halogen,
    wherein the relative metal composition of the substrate surface is about the same after etching.

2. The method of claim 1, wherein the mixed metal oxide comprises indium and at least one additional metal.

3. The method of claim 1, wherein the mixed metal oxide comprises gallium and at least one additional metal.

4. The method of claim 1, wherein the mixed metal oxide comprises zinc and at least one additional metal.

5. The method of claim 1, wherein the mixed metal oxide comprises indium, gallium and zinc.

6. The method of claim 1, wherein the halogenation agent comprises HF.

7. The method of claim 1, wherein the halogenation agent comprises $NF_3$.

8. The method of claim 1, wherein in the ligand transfer agent comprises $MR_2X$ and M is In, Ga, Al or B, R is a C1 to C6 group, and X is a halogen.

9. The method of claim 1, wherein in the ligand transfer agent comprises $MR_3$ and M is In, Ga, Al or B, and R is a C1 to C6 group.

10. The method of claim 1, wherein the ligand transfer agent comprises one or more of $InR_2X$ or $InR_3$, R is a C1 to C6 alkyl group, and X is a halogen.

11. The method of claim 1, wherein the ligand transfer agent comprises one or more of $GaR_2X$ or $GaR_3$, R is a C1 to C6 group, and X is a halogen.

12. The method of claim 1, wherein the ligand transfer agent comprises one or more of $BR_2X$ or $BR_3$, R is a C1 to C6 group, and X is a halogen.

13. The method of claim 1, wherein the halogenation agent comprises a compound with the empirical formula $SF_n$, where n is 2 to 6.

14. The method of claim 13, wherein the halogenation agent comprises $SF_4$.

15. The method of claim 13, wherein the halogenation agent comprises $SF_6$.

16. The method of claim 1, wherein the ligand transfer agent comprises one or more of $AlR_2X$ or $AlR_3$, R is a C1 to C6 group, and X is a halogen.

17. The method of claim 16, wherein the ligand transfer agent comprises $Al(CH_3)_2Cl$.

18. The method of claim 16, wherein the ligand transfer agent comprises $Al(CH_3)_3$.

19. A method of etching a substrate surface, the method comprising:
    providing a substrate surface comprising a mixed metal oxide of indium oxide, gallium oxide and zinc oxide, the substrate surface having a relative metal composition;
    exposing the substrate surface to HF to form a halogenated substrate surface; and
    exposing the halogenated substrate surface to $Al(CH_3)_3$ to etch the halogenated substrate surface to remove the indium oxide, gallium oxide and zinc oxide,
    wherein the relative metal composition of the substrate surface is about the same after etching.

20. A method of selectively etching a substrate surface, the method comprising:
    providing a substrate having a first surface and a second surface, the first surface comprising silicon oxide and the second surface comprising a mixed metal oxide of indium oxide, gallium oxide and zinc oxide, the second surface having a relative metal composition;
    exposing the substrate to a halogenation agent to form a halogenated second surface; and
    exposing the substrate to a ligand transfer agent to etch the halogenated second surface to remove the indium oxide, gallium oxide and zinc oxide,
    wherein the relative metal composition of the second surface is about the same after etching, and if the first surface is etched, an etch rate of the second surface is greater than or equal to about 25 times an etch rate of the first surface.

* * * * *